United States Patent
Okamura et al.

(10) Patent No.: US 10,575,418 B2
(45) Date of Patent: Feb. 25, 2020

(54) ELECTRONIC DEVICE

(71) Applicant: FANUC CORPORATION, Yamanashi (JP)

(72) Inventors: Hideki Okamura, Yamanashi-ken (JP); Junichi Sakamoto, Yamanashi-ken (JP)

(73) Assignee: FANUC CORPORATION, Yamanashi (JP)

(*) Notice: Subject to any disclaimer, the term of this patent is extended or adjusted under 35 U.S.C. 154(b) by 0 days.

(21) Appl. No.: 16/287,343

(22) Filed: Feb. 27, 2019

(65) Prior Publication Data

US 2019/0269024 A1     Aug. 29, 2019

(30) Foreign Application Priority Data

Feb. 28, 2018  (JP) ................................. 2018-034909

(51) Int. Cl.
  *H05K 5/00*  (2006.01)
  *G06F 1/16*  (2006.01)

(52) U.S. Cl.
  CPC ......... *H05K 5/0039* (2013.01); *G06F 1/1633* (2013.01)

(58) Field of Classification Search
  CPC ............................. H05K 5/0039; G06F 1/1633
  See application file for complete search history.

(56) References Cited

U.S. PATENT DOCUMENTS

| 2001/0017767 | A1  | 8/2001  | Kitamura et al. |           |
|--------------|-----|---------|-----------------|-----------|
| 2008/0019085 | A1* | 1/2008  | Nakajima        | G06F 1/1616 361/679.08 |
| 2008/0252774 | A1* | 10/2008 | Chen            | H04N 5/2254 348/374 |
| 2010/0182748 | A1* | 7/2010  | Huang           | G06F 1/1656 361/690 |
| 2013/0058059 | A1* | 3/2013  | Min             | H05K 9/0026 361/756 |
| 2014/0177181 | A1* | 6/2014  | Malek           | H05K 9/003 361/749 |

FOREIGN PATENT DOCUMENTS

| JP | 11261274 A   | 9/1999  |
| JP | 2001237557 A | 8/2001  |
| JP | 2001244661 A | 9/2001  |
| JP | 2017220597 A | 12/2017 |

OTHER PUBLICATIONS

English Abstract for Japanese Publication No. 2001-237557 A, published Aug. 31, 2001, 1 pg.
English Abstract and Machine Translation for Japanese Publication No. 2001-244661 A, published Sep. 7, 2001, 10 pgs.
English Abstract and Machine Translation for Japanese Publication No. 2017-220597 A, published Dec. 14, 2017, 12 pgs.
English Abstract and Machine Translation for Japanese Publication No. H11-261274 A, published Sep. 24, 1999, 13 pgs.

* cited by examiner

*Primary Examiner* — Rockshana D Chowdhury
(74) *Attorney, Agent, or Firm* — Fredrikson & Byron, P.A.

(57) ABSTRACT

An electronic device includes: a casing; and an electronic circuit board housed within the casing. The electronic device further includes a protector which is provided on a surface of the electronic circuit board that faces the casing. The height of the protector is larger than the height of an electronic component mounted on the surface of the electronic circuit board that faces the casing. In a state that the electronic circuit board is housed within the casing, the protector abuts on a surface of the casing that faces the electronic circuit board.

3 Claims, 20 Drawing Sheets

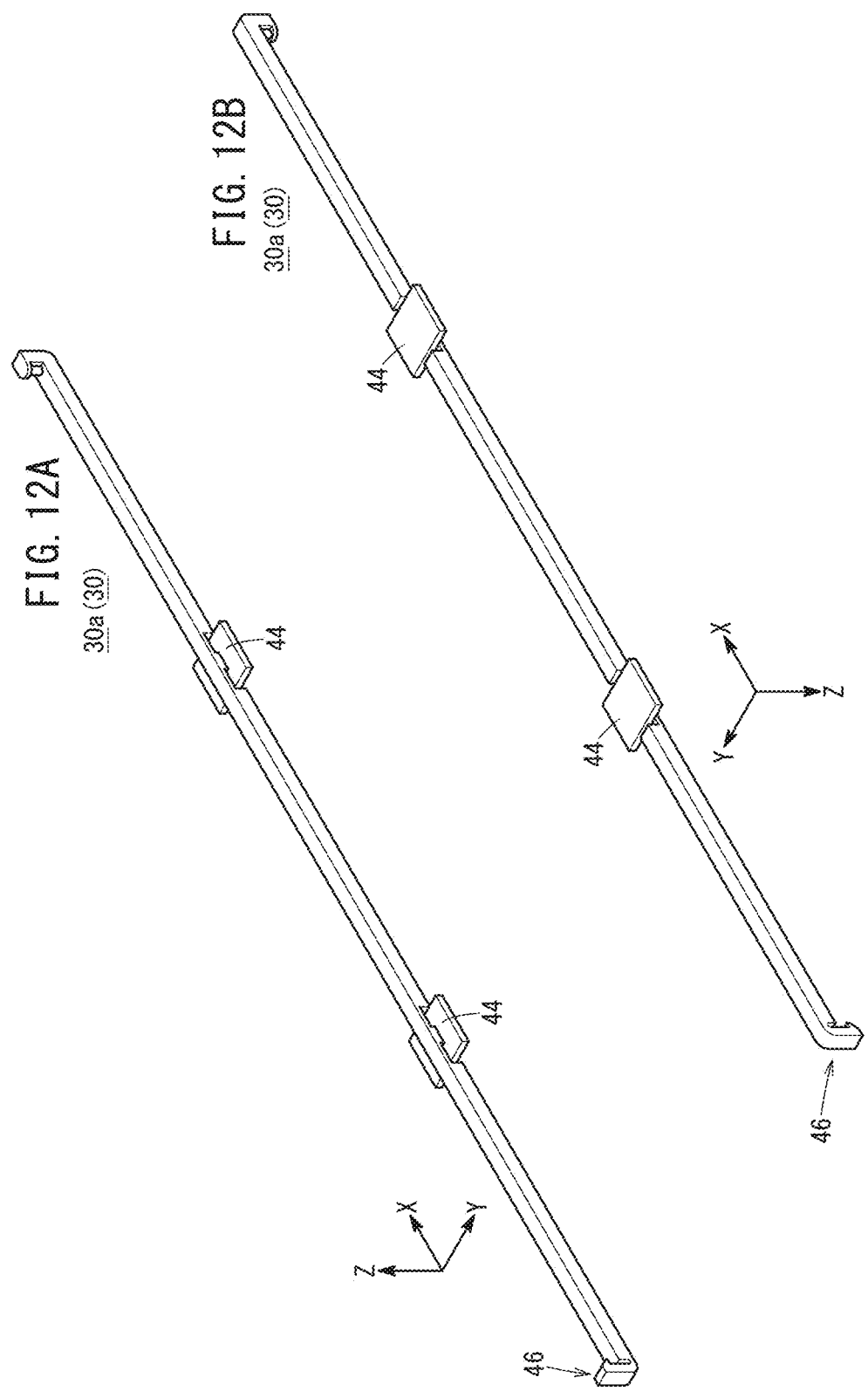

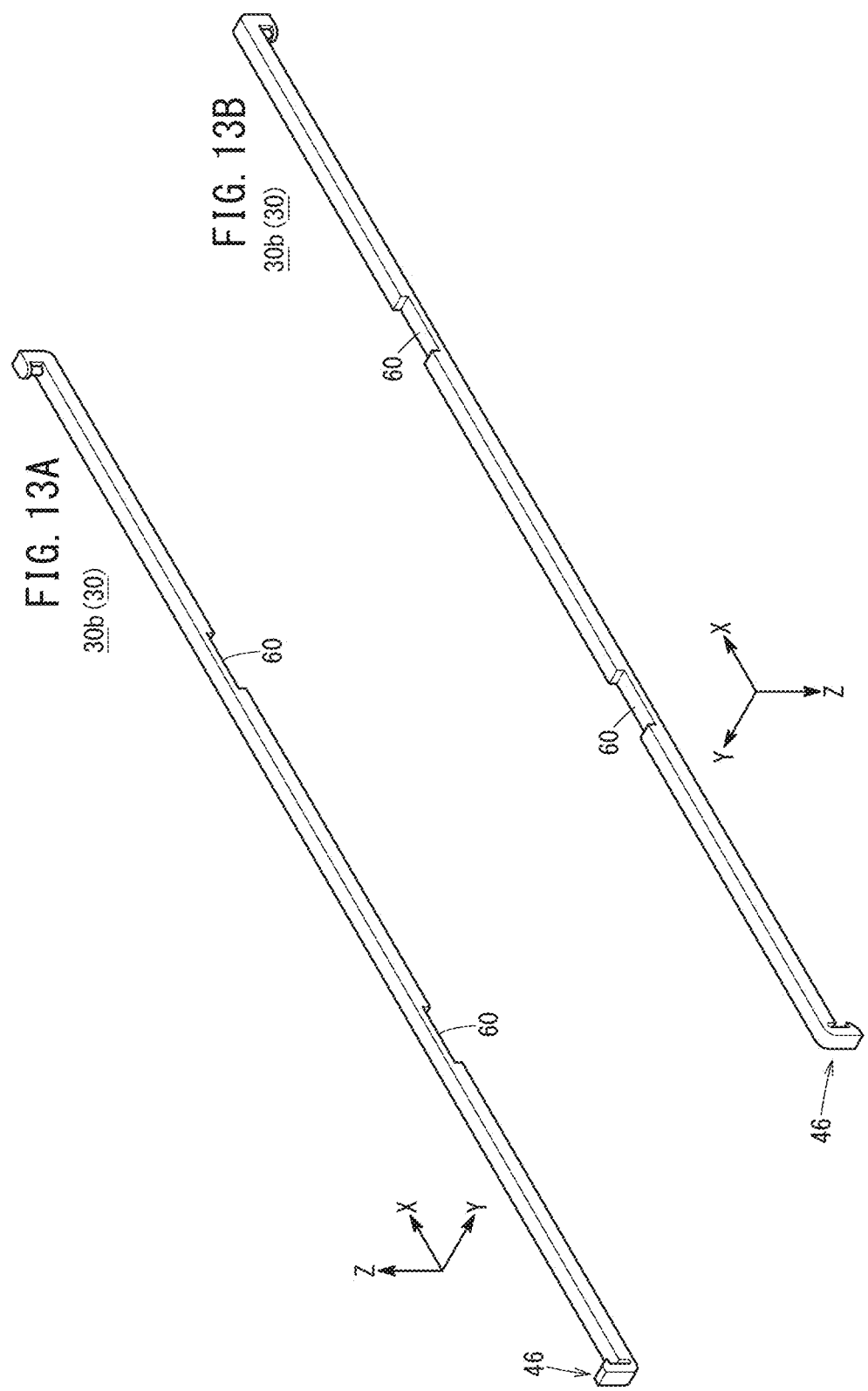

ELECTRONIC DEVICE

CROSS-REFERENCE TO RELATED APPLICATION

This application is based upon and claims the benefit of priority from Japanese Patent Application No. 2018-034909 filed on Feb. 28, 2018, the contents of which are incorporated herein by reference.

BACKGROUND OF THE INVENTION

Field of the Invention

The present invention relates to an electronic device that has an electronic circuit board housed on an inside of a casing.

Description of the Related Art

Japanese Laid-Open Patent Publication No. 2001-237557 discloses a housing case that houses an electronic circuit board.

SUMMARY OF THE INVENTION

In the technology described in Japanese Laid-Open Patent Publication No. 2001-237557, there is a risk that when housing the electronic circuit board, an electronic component mounted on the electronic circuit board interferes with a casing (the housing case), and the electronic component is damaged.

The present invention has been made to solve the above-described problem, and has an object of providing an electronic device that can avoid interference of an electronic component and a casing when placing an electronic circuit board in the interior of the casing.

An aspect of the present invention is an electronic device including a casing and an electronic circuit board housed within the casing, the electronic device further including a protector which is provided on a surface of the electronic circuit board that faces the casing. The height of the protector is larger than the height of an electronic component mounted on the surface of the electronic circuit board that faces the casing. In a state that the electronic circuit board is housed within the casing, the protector abuts on a surface of the casing that faces the electronic circuit board.

The present invention makes it possible to avoid interference of the electronic component and the casing when housing the electronic circuit board within the casing.

The above and other objects, features, and advantages of the present invention will become more apparent from the following description when taken in conjunction with the accompanying drawings, in which preferred embodiments of the present invention are shown by way of illustrative example.

BRIEF DESCRIPTION OF THE DRAWINGS

FIGS. 12A and 12B are perspective views of the protector;

FIGS. 13A and 13B are perspective views of the protector;

DESCRIPTION OF THE PREFERRED EMBODIMENTS

First Embodiment

[Configuration of CNC]

Figure 1:
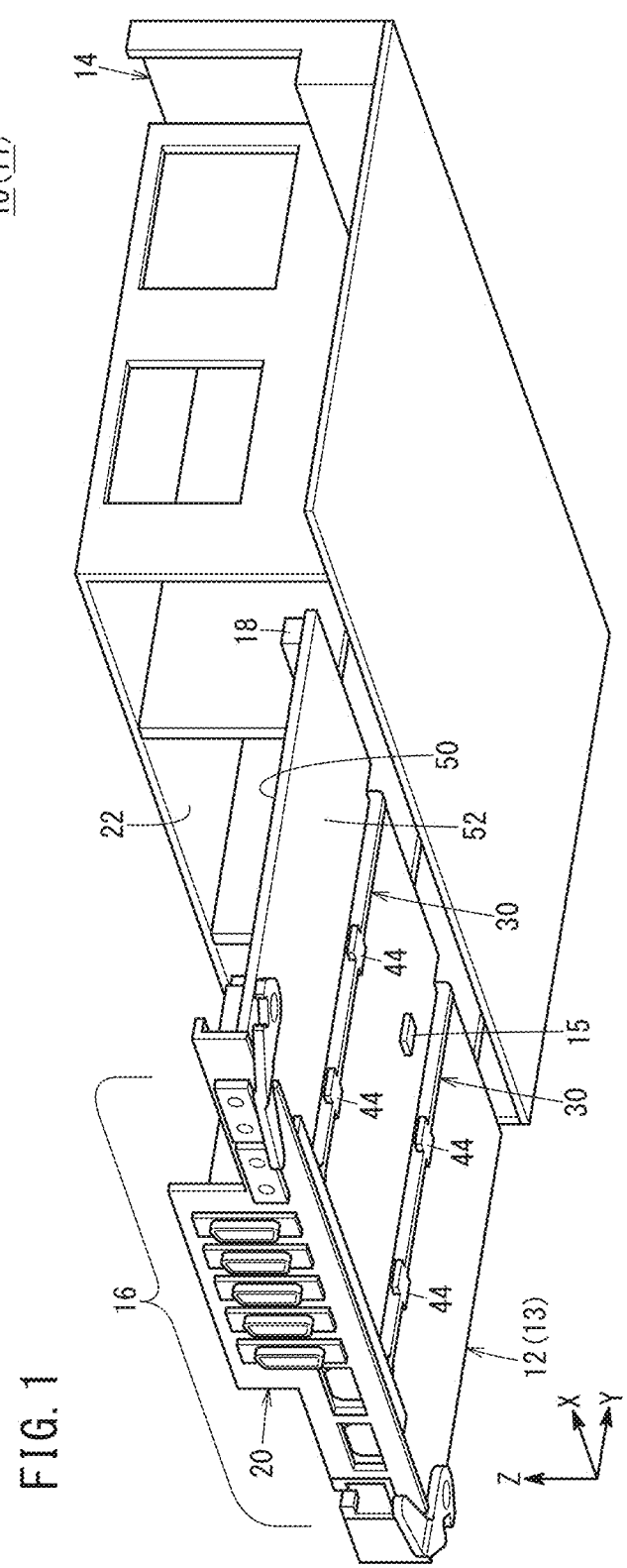
FIG. 1 is an exploded perspective view of a computer numerical controller (CNC)
Figure 2:
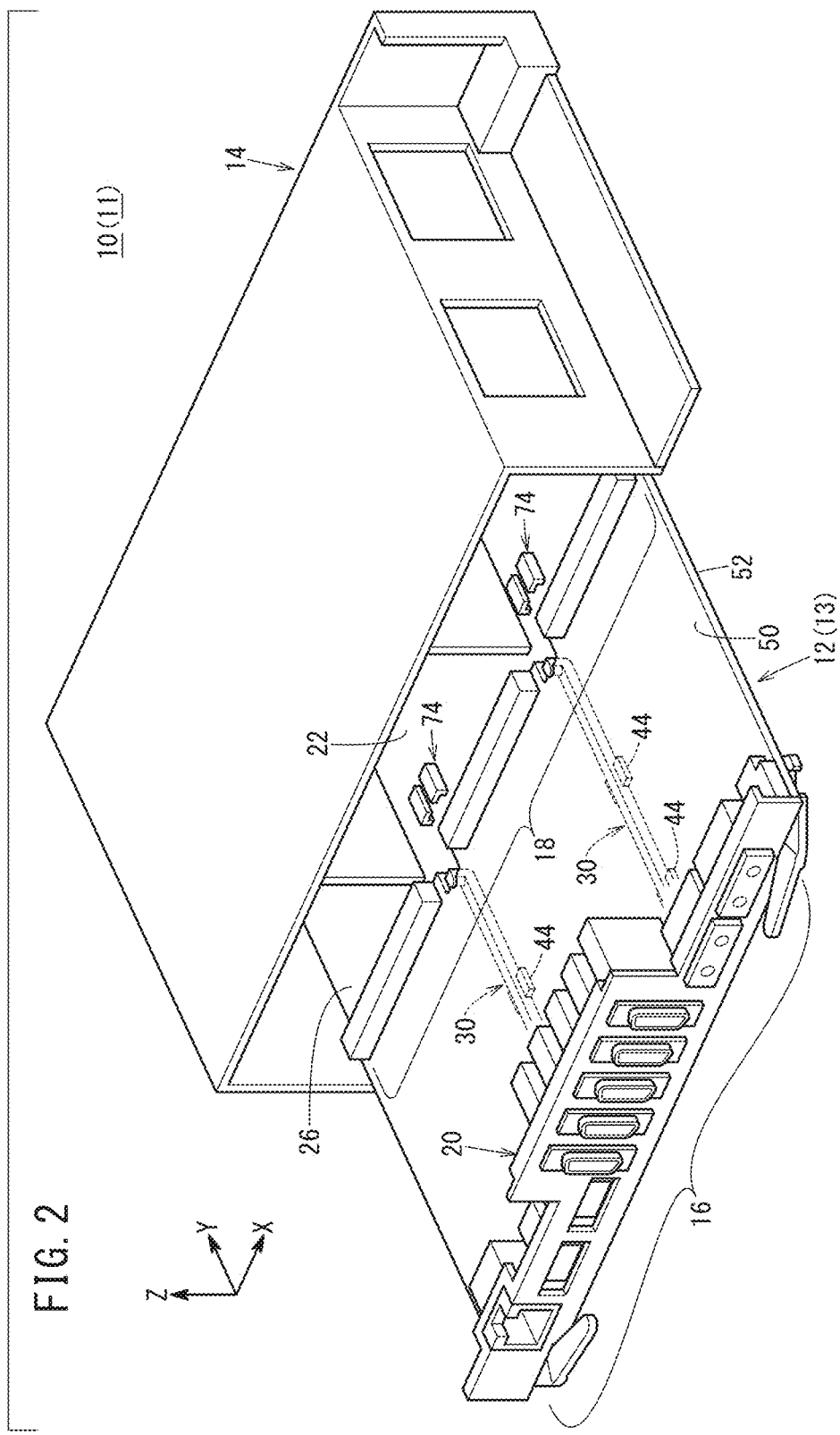
FIG. 2 is an exploded perspective view of the CNC.
Figure 3:
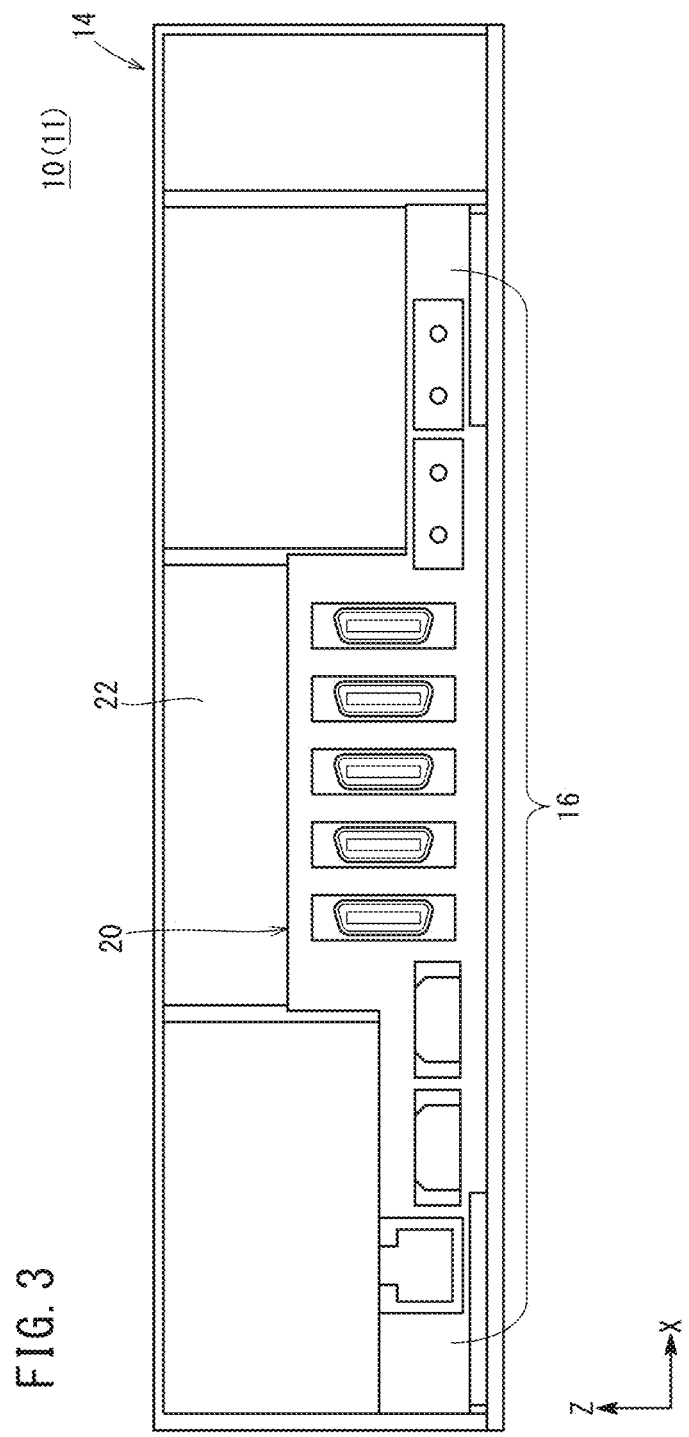
FIG. 3 is a side view of the CNC with a main board housed within a casing.

FIGS. 1 and 2 are exploded perspective views of a computer numerical controller (CNC) 10. FIG. 3 is a side view of the CNC 10 with a main board 12 housed within its casing 14. The CNC 10 is a control device that performs control of a machine tool, a wire electric discharge machine or the like, and has inserted within its casing 14 a plurality of electronic circuit boards 13 on which various kinds of electronic components 15 are mounted. The CNC 10 configures an electronic device 11. The casing 14 of the CNC 10 is formed by molding a resin material, and is formed in a substantially rectangular parallelepiped box shape by a plurality of members.

Hereafter, for purposes of explanation, an X axis, a Y axis, and a Z axis are set along respective orthogonal sides of the casing 14, as shown in FIG. 1. The drawings other than FIG. 1 also show an X axis, a Y axis, and a Z axis that correspond to the X axis, the Y axis, and the Z axis of FIG. 1. In order to make the drawings easy to see, FIGS. 1 to 3 show only the main board 12 as one of the plurality of electronic circuit boards 13.

The main board 12 is a substantially rectangular shaped plate member, and is mounted with: the electronic component 15; a plurality of first connectors 16 for connecting an unillustrated external device and the CNC 10; and a plurality of second connectors 18 for connecting an unillustrated back board and the main board 12 within the casing 14. A face plate 20 is attached to a side on a Y axis negative direction side of the main board 12. The plurality of first connectors 16 are mounted, aligned in an X axis direction, on the Y axis negative direction side of the main board 12. The plurality of second connectors 18 are mounted, aligned in the X axis direction, on a Y axis positive direction side of the main board 12. Note that although FIGS. 1 to 3 do not show an electronic circuit board 13 other than the main board 12, the main board 12 is of largest area among the electronic circuit boards 13 housed in the casing 14.

A side surface of the casing 14 on the Y axis negative direction side is open overall, and forms an opening 22. The main board 12 is housed within the casing 14 by being inserted into the casing 14 in a Y axis positive direction, at a position, within the opening 22, on a Z axis negative direction side. The face plate 20 closes the opening 22 of the casing 14 in a state where the main board 12 is housed within the casing 14. The face plate 20 has formed therein a plurality of through-holes 24 (FIG. 4) that penetrate in a Y axis direction, and the first connectors 16 are exposed to outside from these through-holes 24.

Figure 4:
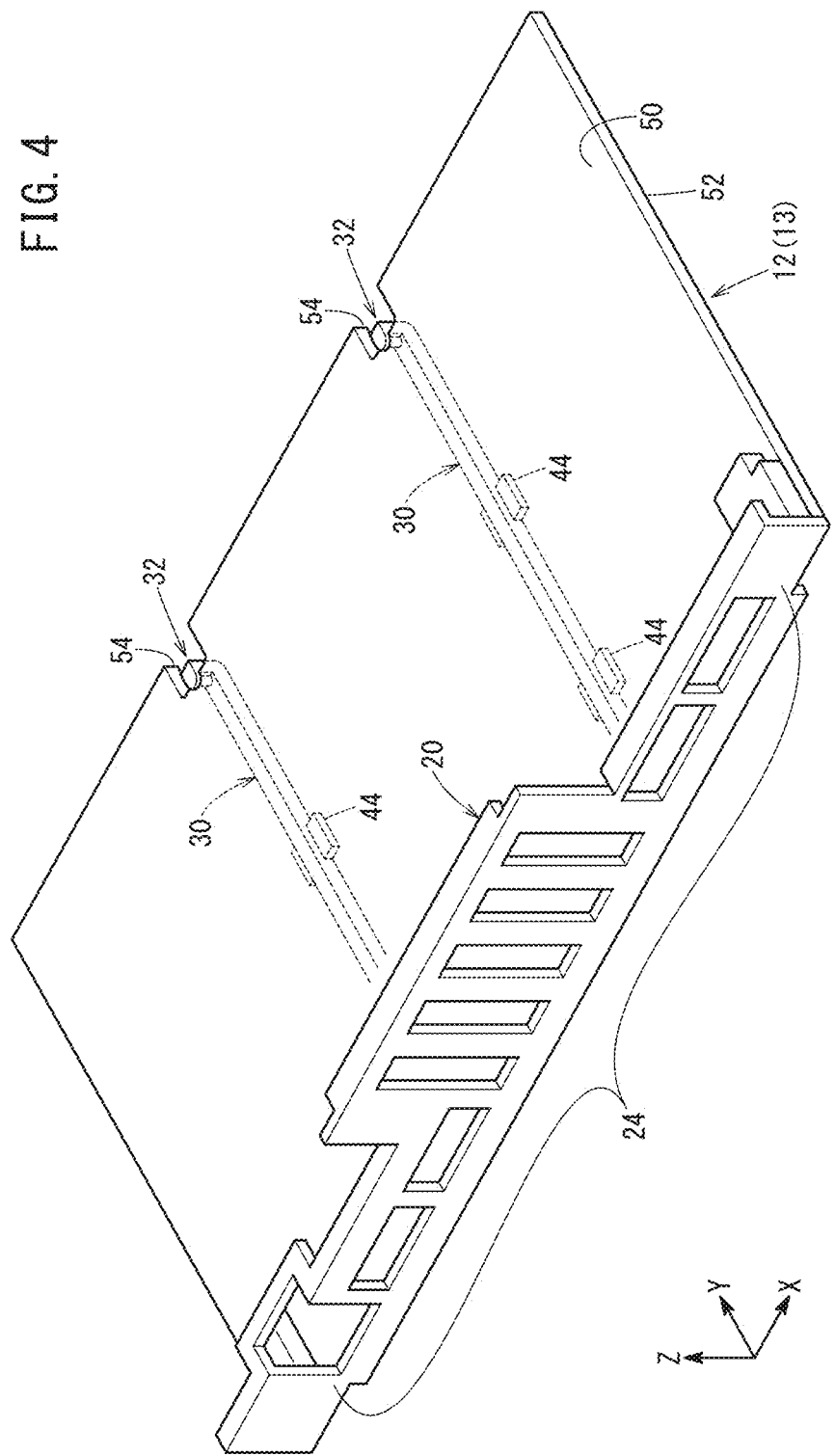
FIG. 4 is a perspective view showing the main board, a face plate, and a protector.
Figure 5:
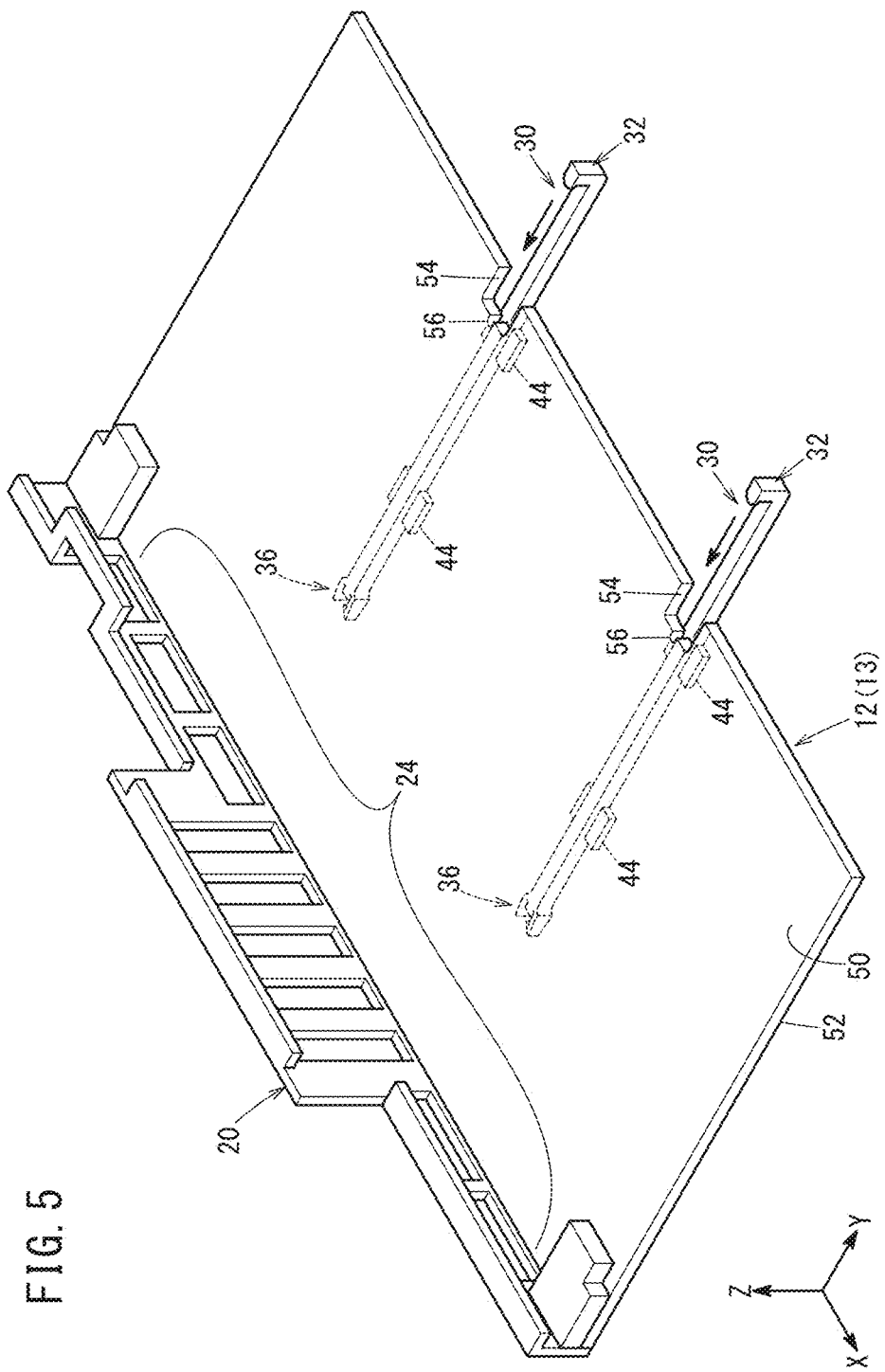
FIG. 5 is a view showing a method of attaching the protector to the main board and the face plate.
Figure 6A:
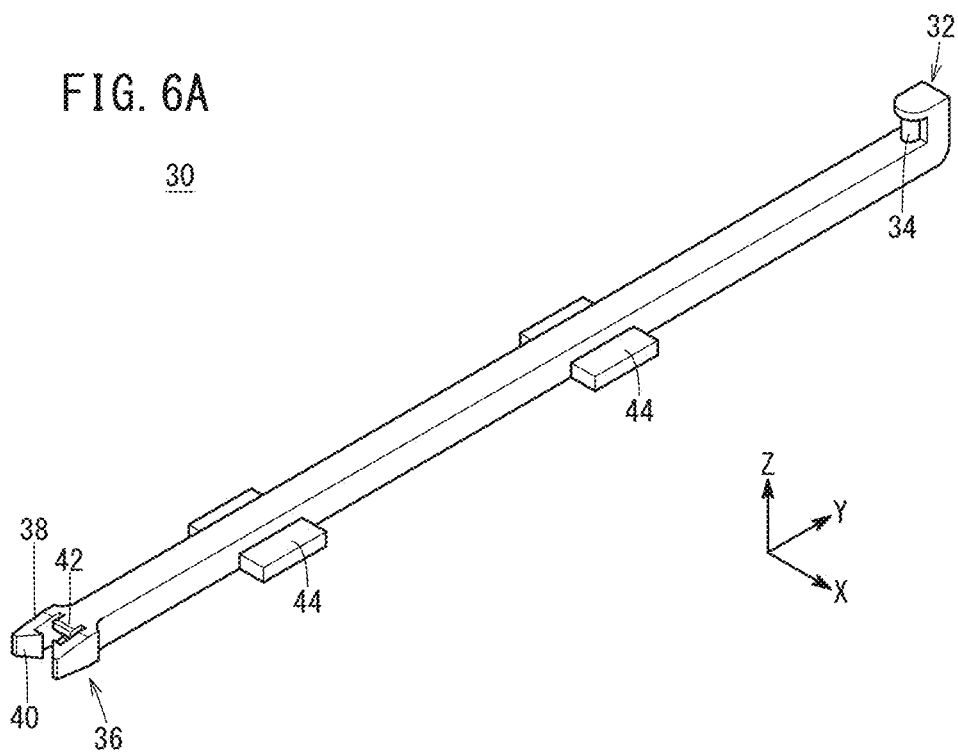
FIGS. 6A and 6B are perspective views of the protector.
Figure 6B:
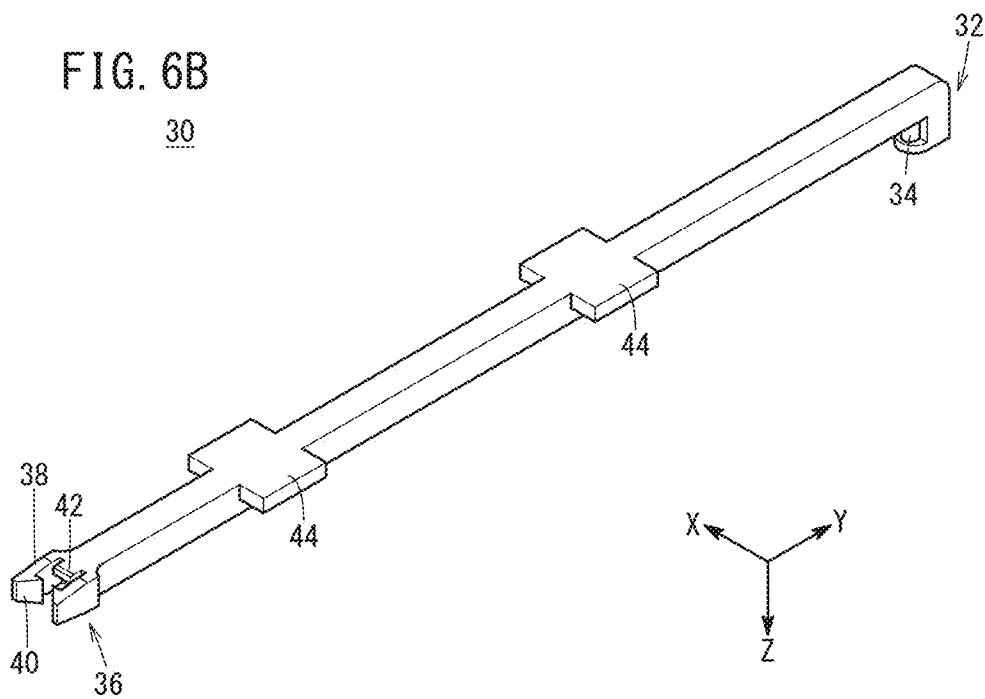
Figure 7A:
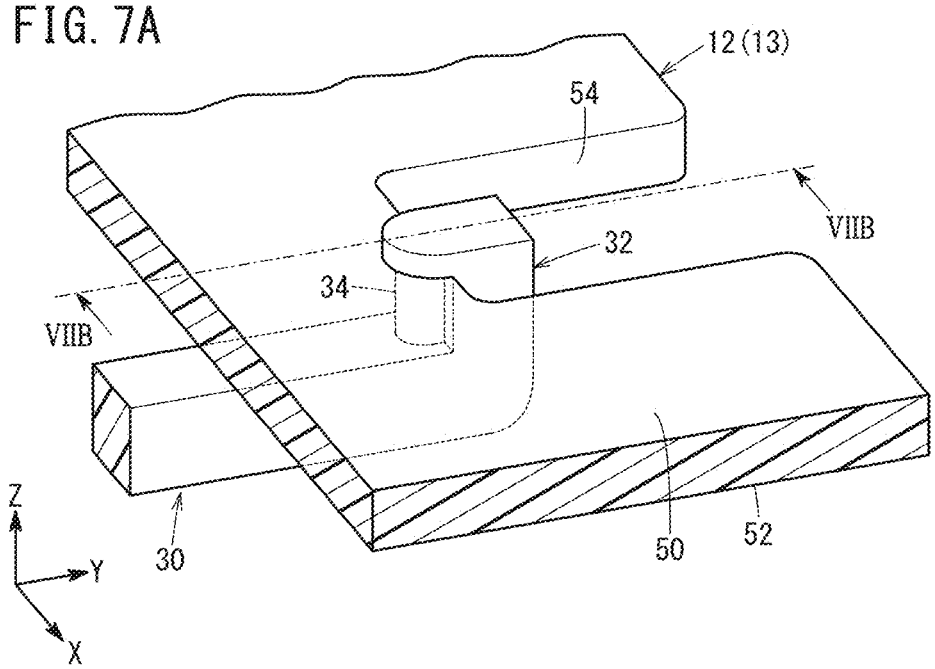
FIG. 7A is an enlarged view showing a connecting portion of the protector and the main board.
Figure 7B:
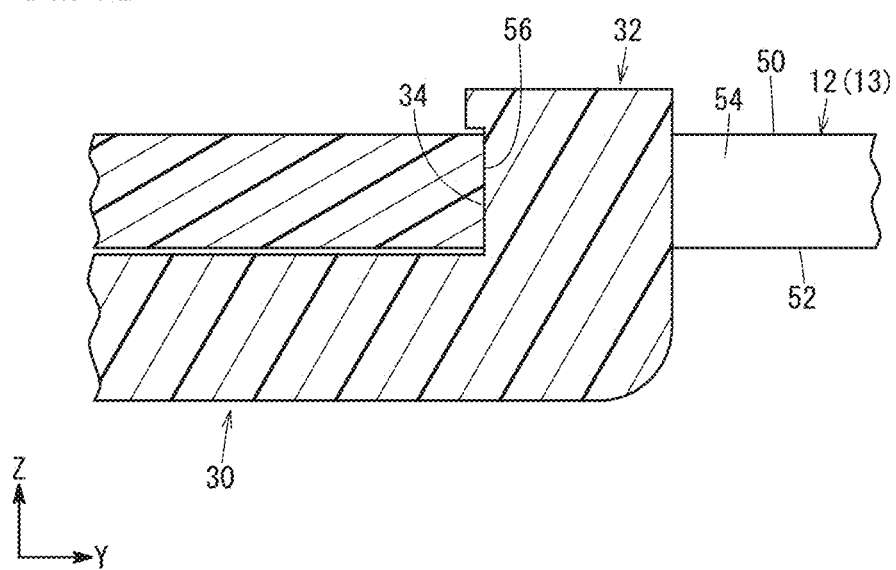
FIG. 7B is a cross-sectional view taken along the line VIIB-VIIB in FIG. 7A.
Figure 8A:
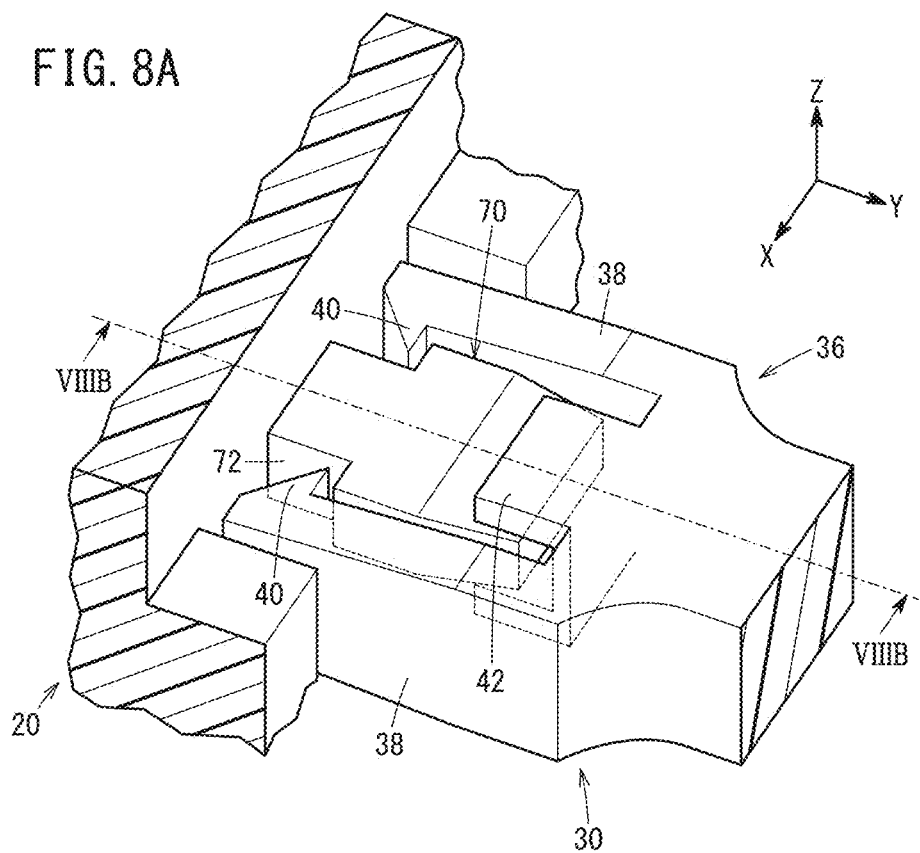
FIG. 8A is an enlarged view showing a connecting portion of the protector and the face plate.
Figure 8B:
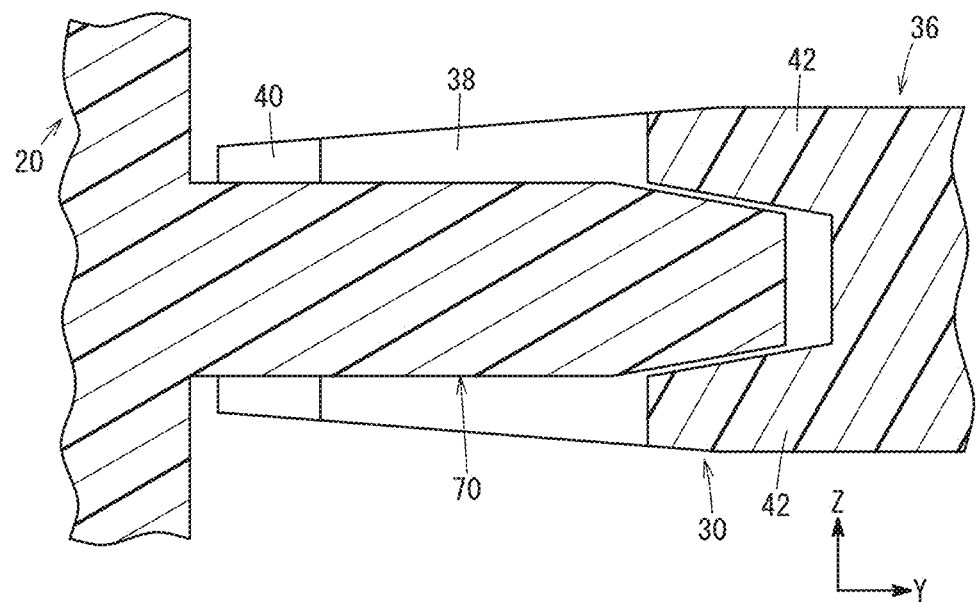
FIG. 8B is a cross-sectional view taken along the line VIIIB-VIIIB in FIG. 8A.

FIG. 4 is a perspective view showing the main board 12, the face plate 20, and a protector 30. FIG. 5 is a view showing a method of attaching the protector 30 to the main board 12 and the face plate 20. FIGS. 6A and 6B are perspective views of the protector 30. FIG. 7A is an enlarged view showing a connecting portion of the protector 30 and the main board 12. FIG. 7B is a cross-sectional view taken along the line VIIB-VIIB in FIG. 7A. FIG. 8A is an enlarged view showing a connecting portion of the protector 30 and the face plate 20. FIG. 8B is a cross-sectional view taken along the line VIIIB-VIIIB in FIG. 8A. Now, a surface of the main board 12 on a Z axis positive direction side is assumed to be a front surface 50, and a surface of the main board 12 on the Z axis negative direction side is assumed to be a back surface 52. A surface of the casing 14 facing the back surface 52 of the main board 12 is assumed to be an interior side surface 26.

The protector 30 is provided on the back surface 52 of the main board 12. The protector 30 is formed as a rod-shaped member extending in the Y axis direction, in a state of being attached to the main board 12. Two of the protectors 30 are provided, separated in the X axis direction. A height of the protector 30 in a Z axis direction is formed higher than a height in the Z axis direction of the electronic component 15 mounted on the back surface 52 of the main board 12. Moreover, the height of the protector 30 in the Z axis direction is formed in such a manner that, in a state where the main board 12 with the protector 30 attached thereto is housed within the casing 14, a side surface of the protector 30 on the Z axis negative direction side abuts on the interior side surface 26 of the casing 14.

The protector 30 is formed in such a manner that a Y axis direction length of the protector 30 will be longer than a distance between the face plate 20 and an electronic component 15 mounted in a position furthest from the face plate 20 in the Y axis direction, of the electronic components 15 mounted on the back surface 52.

In some cases, due to residual stress during molding of the casing 14, the interior side surface 26 of the casing 14 deforms toward an inside of the casing 14, whereby a warpage occurs thereon. When the main board 12 is inserted into the casing 14, the side surface of the protector 30 on the Z axis negative direction side moves while abutting on the interior side surface 26 of the casing 14, hence the warpage of the interior side surface 26 is corrected so as to be planar.

As shown in FIG. 5, the protector 30 is attached to the main board 12 from the Y axis positive direction side. An end section of the protector 30 on the Y axis positive direction side is engaged with the main board 12, and an end section of the protector 30 on the Y axis negative direction side is engaged with the face plate 20. As a result, as shown in FIG. 4, the protector 30 is fixed to the face plate 20 and the main board 12.

As shown in FIGS. 7A and 7B, the end section of the protector 30 on the Y axis positive direction side has formed therein an engaging section 32 that extends in a Z axis positive direction. A side surface of the engaging section 32 on the Y axis negative direction side has a groove section 34 formed therein. A side of the main board 12 on the Y axis positive direction side has a cutout section 54 formed by cutting out a part of the side. An end section of the cutout section 54 on the Y axis negative direction side has formed therein a small cutout section 56 whose width in the X axis direction is shorter than that of the cutout section 54. The groove section 34 of the protector 30 is inserted in the Y axis negative direction into the small cutout section 56 of the main board 12, whereby the groove section 34 engages with the small cutout section 56.

The end section of the protector 30 on the Y axis negative direction side has a snap-fit 36 formed therein. The snap-fit 36 has formed therein first arm sections 38 that extend in substantially a Y shape, as shown in FIG. 8A. An inwardly projecting first hook section 40 is formed in a tip of the first arm section 38. A side surface of the face plate 20 on a Y axis positive direction side has formed therein a projection 70 that projects in the Y axis positive direction. A base portion of the projection 70 has formed therein a constricted section 72 whose width is narrower than that of another portion. The first hook sections 40 of the protector 30 engage with the constricted section 72 formed in the projection 70 of the face plate 20, whereby Y-axis movement of the protector 30 relative to the face plate 20 is restricted.

As shown in FIG. 8B, the protector 30 has, between the first arm sections 38, two extended sections 42 which is formed extending to the Y axis negative direction side at two places separated from each other in the Z axis direction. A tip of the projection 70 of the face plate 20 is inserted between the extended sections 42 at the two places. As a result, Z-axis movement of the end section of the protector 30 on the Y axis negative direction side is restricted.

As shown in FIGS. 6A and 6B, a restricting section 44 is formed at two places in a middle section of the protector 30 in the Y axis direction. The restricting section 44 has its width in the X axis direction which is larger than that of another portion of the protector 30, and has its height in the Z axis direction which is lower than that of another portion of the protector 30.

Figure 9:
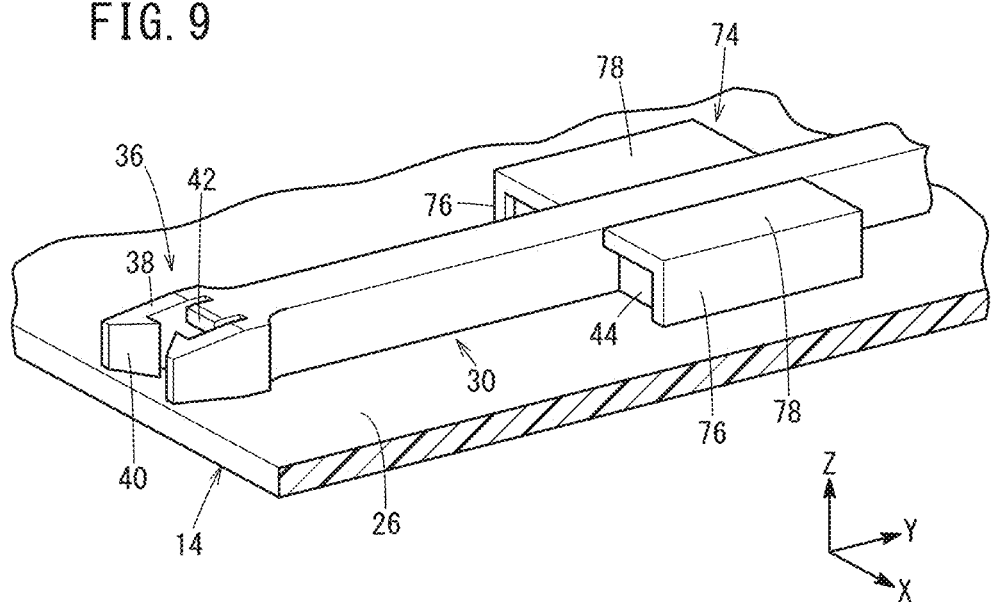
FIG. 9 is an enlarged view of a restricting section of the protector and a restricted section of the casing.

FIG. 9 is an enlarged view of the restricting section 44 of the protector 30 and a restricted section 74 of the casing 14. The restricted section 74 is formed on the interior side surface 26 of the casing 14. When the restricted section 74 is viewed from the Y axis direction, the restricted section 74 is configured from: vertical wall sections 76 that are formed at two places separated from each other in the X axis direction, and that extend in the Z axis positive direction from the interior side surface 26; and horizontal wall sections 78 that extend to inner sides of the two vertical wall sections 76, from tips of the vertical wall sections 76. Tips of the two horizontal wall sections 78 are separated from each other in the X axis direction.

When the main board 12 is inserted in the casing 14, the restricting section 44 of the protector 30 is inserted into the restricted section 74 of the interior side surface 26. At this time, a rod-shaped portion of the protector 30 is inserted between the two horizontal wall sections 78 of the restricted section 74. In some cases, due to a temperature rise of the casing 14, there occurs in the interior side surface 26 of the casing 14 a warpage that deforms toward an outside of the casing 14. When there occurs a warpage of the interior side surface 26 deforming toward the outside of the casing 14, the restricting section 44 of the protector 30 abuts on the restricted section 74, whereby the warpage of the interior side surface 26 is suppressed.

[Operational Advantages]

The casing 14 is formed by molding a resin material, and hence, due to residual stress during molding, a side surface of the casing 14 tends to deform inwardly, i.e., a warpage occurs in some cases. Generally, the main board 12 whose area is larger than those of the other electronic circuit boards 13 is inserted into a Z-axis negative direction side portion of the opening 22 of the casing 14, and the Z-axis negative direction side portion of the opening 22 has only two wall sections at both end sections in the X axis direction. That is, concerning the interior side surface 26, only both its end sections in the X axis direction are supported by the wall sections. Therefore, it has been easier for a warpage, i.e., deformation to the inside of the casing 14, to occur particularly in the interior side surface 26, compared to in another side surface of the casing 14. There is a risk that when an inwardly deforming warpage occurs in the interior side surface 26, the electronic component 15 mounted on the electronic circuit board 13 and the side surface of the casing 14 interfere with each other during insertion/removal of the main board 12 in/from the casing 14, whereby the electronic component 15 is damaged.

Accordingly, in the CNC 10 of the present embodiment, the protector 30 is provided on the back surface 52 of the main board 12, and the height of this protector 30 in the Z axis direction is formed higher than the height of the electronic component 15 mounted on the main board 12. Furthermore, a configuration is adopted whereby the protector 30 abuts on the interior side surface 26 of the casing 14 in a state that the main board 12 is housed within the casing 14. As a result, since the warpage of the interior side surface 26 that deforms inwardly can be corrected by the protector 30 when the main board 12 is inserted into the casing 14, it is possible to prevent interference of the electronic component 15 mounted on the main board 12 with the side surface of the casing 14 that would occur during insertion/removal of the main board 12 in/from the casing 14.

Moreover, in the CNC 10 of the present embodiment, the protector 30 is formed in a rod shape extending in the Y axis direction. As a result, as the main board 12 is being inserted in the casing 14, the protector 30 can make overall correction of the warpage of the interior side surface 26 deformed to the inside of the casing 14.

Moreover, in the CNC 10 of the present embodiment, the protector 30 is formed in such a manner that the Y axis direction length of the protector 30 is longer than the distance between the face plate 20 and the electronic component 15 mounted in a position furthest from the face plate 20 in the Y axis direction, of the electronic components 15 mounted on the back surface 52. This makes it possible to prevent the electronic component 15 mounted on the main board 12 from interfering with the casing 14.

Moreover, in the CNC 10 of the present embodiment, the protector 30 includes the restricting section 44 that engages with the restricted section 74 formed on the interior side surface 26. When the electronic component 15 generates heat, the temperature within the casing 14 rises, and a warpage deforming outwardly of the casing 14 sometimes occurs in the interior side surface 26. When the warpage occurs in the interior side surface 26, the restricting section 44 of the protector 30 abuts on the restricted section 74 of the interior side surface 26, whereby the warpage of the interior side surface 26 can be suppressed.

Note that the number of protectors 30 is not limited to two. Moreover, a position where the protector 30 is disposed on the main board 12 should be appropriately changed. Moreover, the protector 30 may be attached also to an electronic circuit board 13 other than the main board 12.

Second Embodiment

Figure 10:
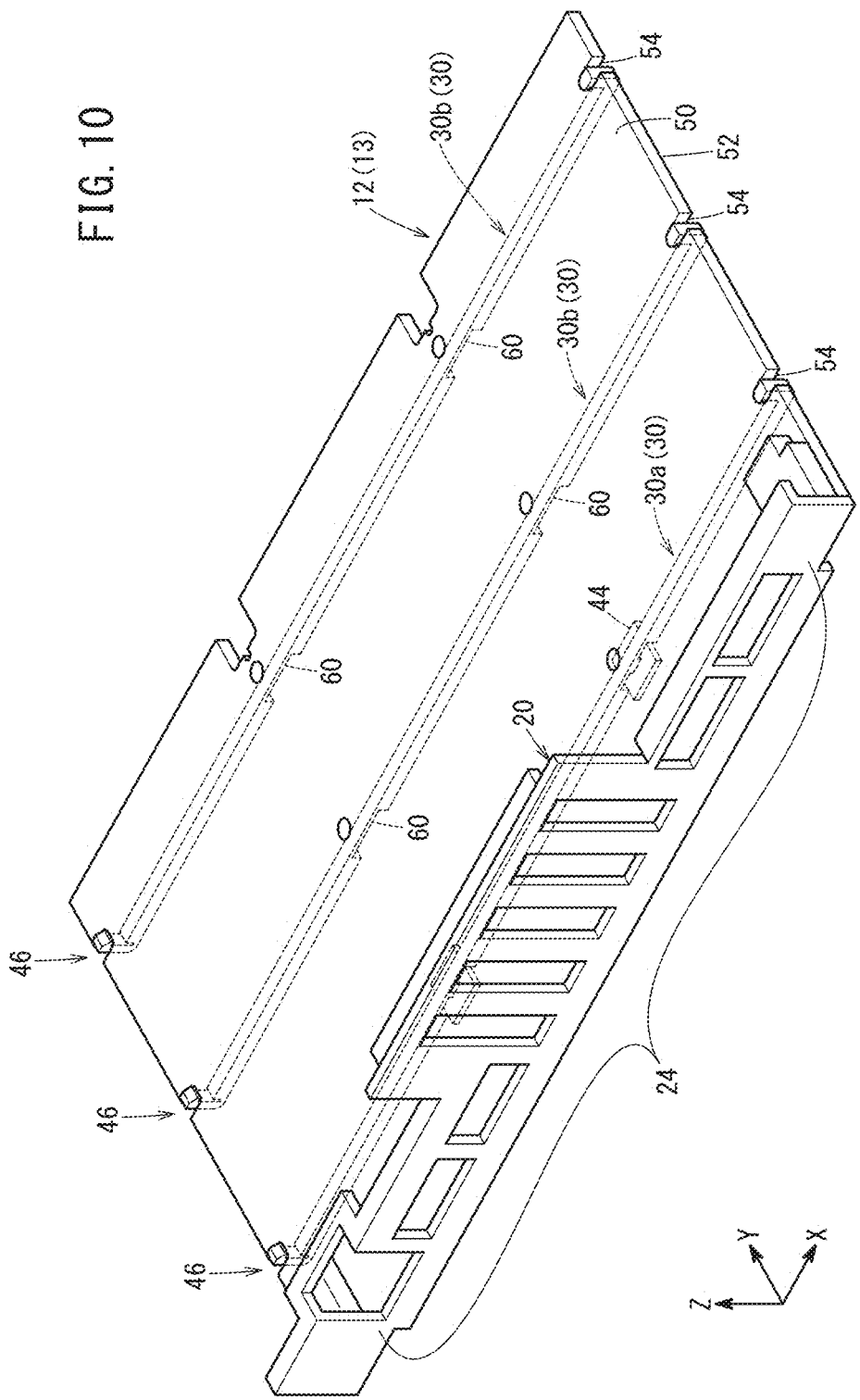
FIG. 10 is a perspective view showing the main board, the face plate, and the protector.
Figure 11:
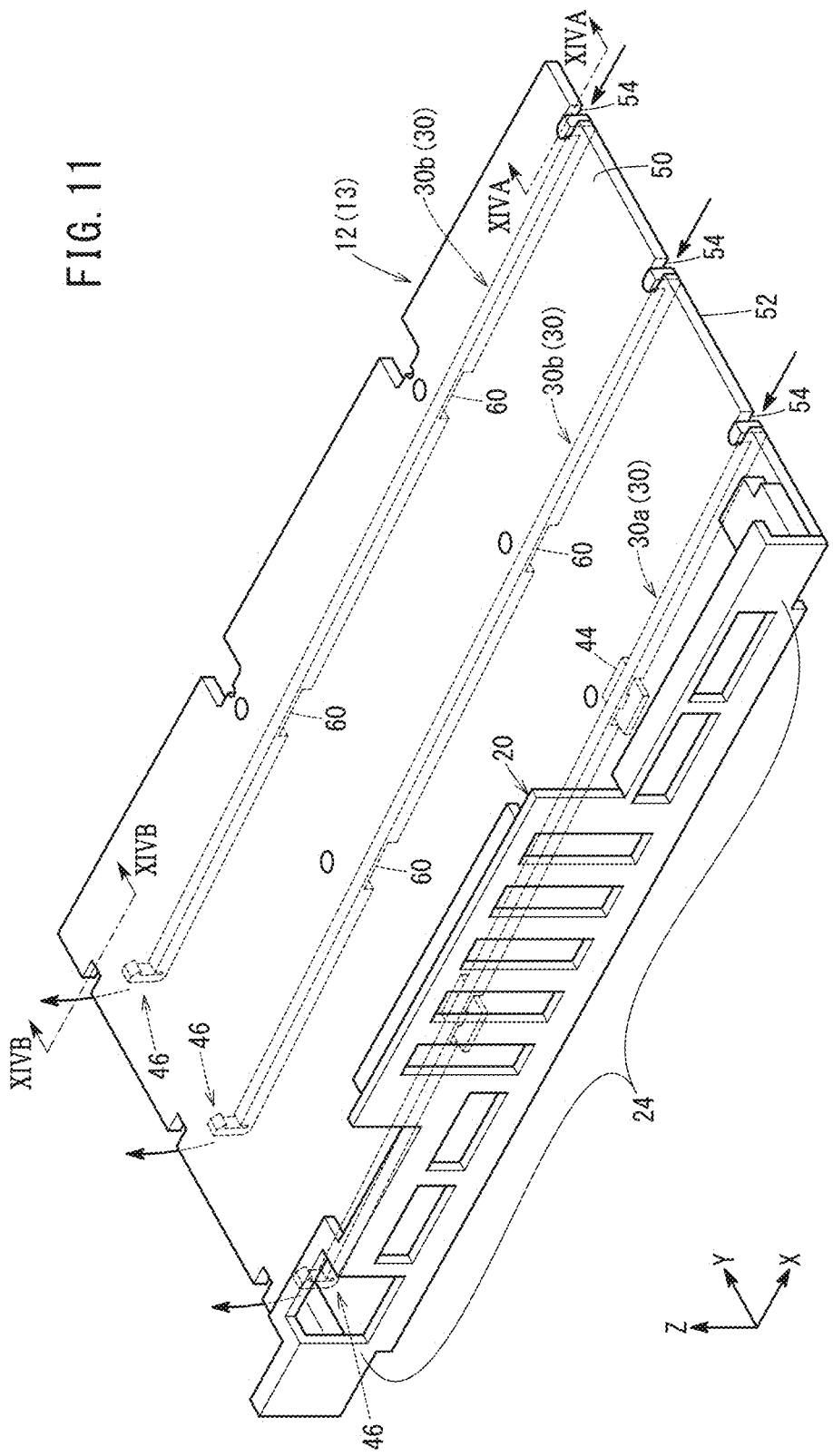
FIG. 11 is a view showing a method of attaching the protector to the main board.
Figure 14A:
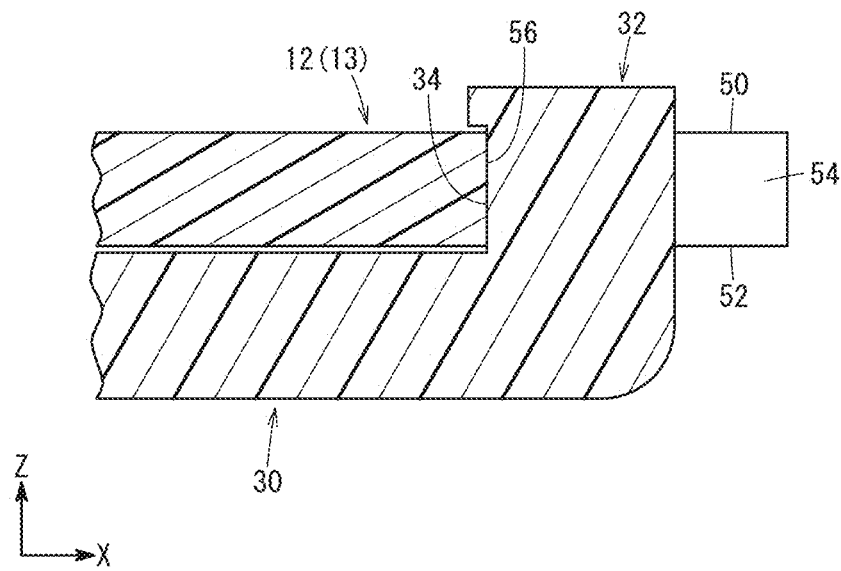
FIG. 14A is a cross-sectional view taken along the line XIVA-XIVA in FIG. 11.
Figure 14B:
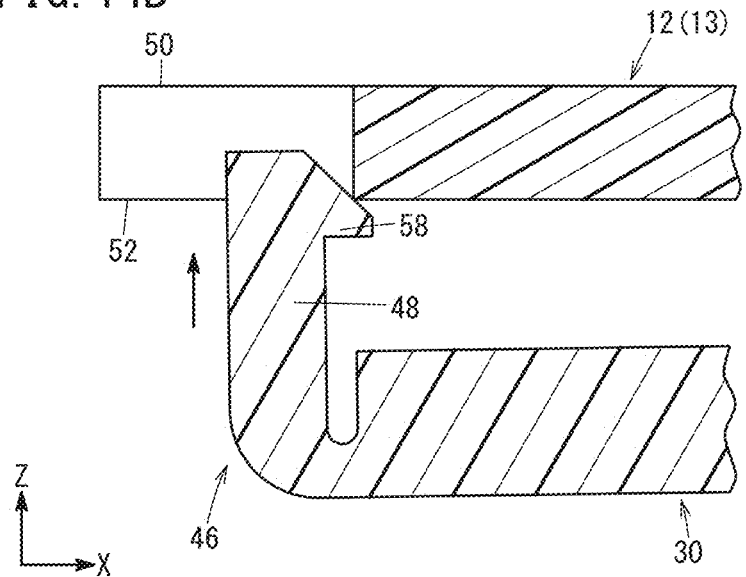
FIG. 14B is a cross-sectional view taken along the line XIVB-XIVB in FIG. 11.

FIG. 10 is a perspective view showing the main board 12, the face plate 20, and the protector 30. FIG. 11 is a view showing a method of attaching the protector 30 to the main board 12. FIGS. 12A and 12B are perspective views of the protector 30 (a first protector 30a). FIGS. 13A and 13B are perspective views of the protector 30 (a second protector 30b). FIG. 14A is a cross-sectional view taken along the line XIVA-XIVA in FIG. 11. FIG. 14B is a cross-sectional view taken along the line XIVB-XIVB in FIG. 11.

The protector 30 is provided on the back surface 52 of the main board 12. The protector 30 is formed as a rod-shaped member extending in the X axis direction, in a state of being attached to the main board 12. Three of the protectors 30 are provided, separated in the Y axis direction. The height of the protector 30 in the Z axis direction is formed higher than the height in the Z axis direction of the electronic component 15 mounted on the back surface 52 of the main board 12. Moreover, the height of the protector 30 in the Z axis direction is formed in such a manner that, in a state where the main board 12 with the protector 30 attached thereto is housed within the casing 14, the side surface of the protector 30 on the Z axis negative direction side abuts on the interior side surface 26 of the casing 14.

One protector of the protectors 30 that is provided on the most positive side in the Y axis direction is positioned closer to the Y axis positive direction side than one electronic component of the electronic components 15 that is mounted on the most positive side in the Y axis direction. When the main board 12 is inserted into the casing 14, the side surface of the protector 30 on the Z axis negative direction side moves while abutting on the interior side surface 26 of the casing 14, hence the warpage of the interior side surface 26 deformed toward the inside of the casing 14 is corrected so as to be planar.

As shown in FIG. 11, the protector 30 is attached to the main board 12 from the X axis positive direction side. An end section on the X axis positive direction side and an end section on the X axis negative direction side, of the protector 30 are each engaged with the main board 12. As a result, as shown in FIG. 10, the protector 30 is fixed to the main board 12.

As shown in FIG. 14A, the end section of the protector 30 on the X axis positive direction side has formed therein the engaging section 32 that extends in the Z axis positive direction. A side surface of the engaging section 32 on the X axis negative direction side has the groove section 34 formed therein. A side of the main board 12 on the X axis positive direction side has a cutout section 54 formed by cutting out a part of the side. An end section of the cutout section 54 on the X axis negative direction side has formed therein a small cutout section 56 whose width in the Y axis direction is shorter than that of the cutout section 54. Note that although the small cutout section 56 is not shown in FIGS. 11, 12A, and 12B, one having the same shape as the small cutout section 56 shown in FIG. 5 of the first embodiment is formed, but positioned differently from the first embodiment. The groove section 34 of the protector 30 is inserted in the X axis negative direction into the small cutout section 56 of the main board 12, whereby the groove section 34 engages with the small cutout section 56.

The end section of the protector 30 on the X axis negative direction side has a snap-fit 46 formed therein. The snap-fit 46 has a second arm section 48 that extends in the Z axis positive direction, as shown in FIG. 14B. A second hook section 58 projecting in the Z axis positive direction is formed at a tip of the second arm section 48. A snap-fit 46 portion of the protector 30 is pressed toward the Z axis positive direction side in a state that the engaging section 32 of the protector 30 is engaged with the main board 12, whereby the second hook section 58 is engaged with the front surface 50 of the main board 12.

The protector 30 includes two differently shaped kinds of protector 30, namely, a first protector 30a and a second protector 30b. Of the three protectors 30 attached to the main board 12, one on the Y axis negative direction side is the first protector 30a, and the other two are the second protectors 30b.

As shown in FIGS. 12A and 12B, the first protector 30a has restricting sections 44 formed at two places in a middle section in the X axis direction of the first protector 30a. The restricting section 44 has its width in the X axis direction that is larger than that of another portion of the first protector 30a, and has its height in the Z axis direction that is lower than that of another portion of the first protector 30a. Similarly to in the first embodiment, the restricted section 74 is formed on the interior side surface 26 of the casing 14. When the main board 12 is inserted within the casing 14, the restricting section 44 of the first protector 30a is inserted into the restricted section 74 of the interior side surface 26. When there occurs a warpage of the interior side surface 26 deforming toward the outside of the casing 14, the restricting section 44 of the protector 30 abuts on the restricted section 74, whereby the warpage is suppressed.

As shown in FIGS. 13A and 13B, the second protector 30b has escape sections 60 at two places in a middle section of the second protector 30b in the X axis direction, the escape sections being formed by cutting out part of the side surface of the second protector 30b on the Z axis negative direction side. Owing to the escape sections 60, it is possible to avoid interference of the second protector 30b and the restricted section 74 when the main board 12 is inserted within the casing 14.

[Operational Advantages]

In the CNC 10 of the present embodiment, the protector 30 is provided on the back surface 52 of the main board 12, and the height of this protector 30 in the Z axis direction is formed higher than the height of the electronic component 15 mounted on the main board 12. Furthermore, a configuration is adopted whereby the protector 30 abuts on the interior side surface 26 of the casing 14 in a state that the main board 12 is housed within the casing 14. As a result, since the warpage of the inwardly deformed interior side surface 26 can be corrected by the protector 30 when the main board 12 is inserted into the casing 14, it can be suppressed that the electronic component 15 mounted on the main board 12 and the side surface of the casing 14 interfere with each other during insertion/removal of the main board 12 in/from the casing 14.

Moreover, in the CNC 10 of the present embodiment, the protector 30 is formed into a rod shape extending in the X axis direction. As a result, the protector 30 can correct the inwardly deformed warpage of the interior side surface 26 over an entire region in the X axis direction.

Note that the number of protectors 30 is not limited to three. Moreover, a position where the protector 30 is disposed on the main board 12 should be appropriately changed. Moreover, the protector 30 may be attached also to an electronic circuit board 13 other than the main board 12.

Third Embodiment

Figure 15:
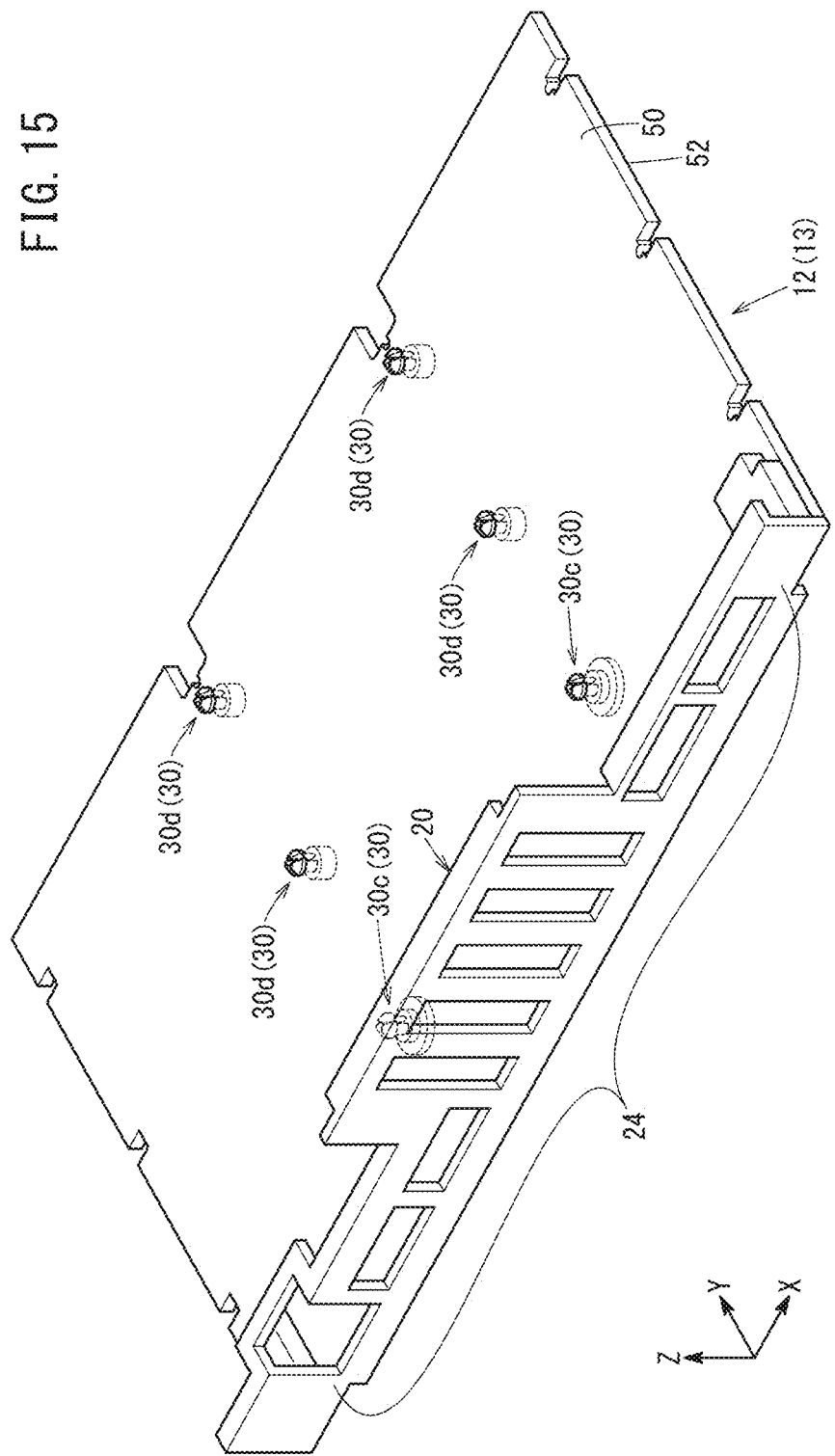
FIG. 15 is a perspective view showing the main board, the face plate, and the protector.
Figure 16A:
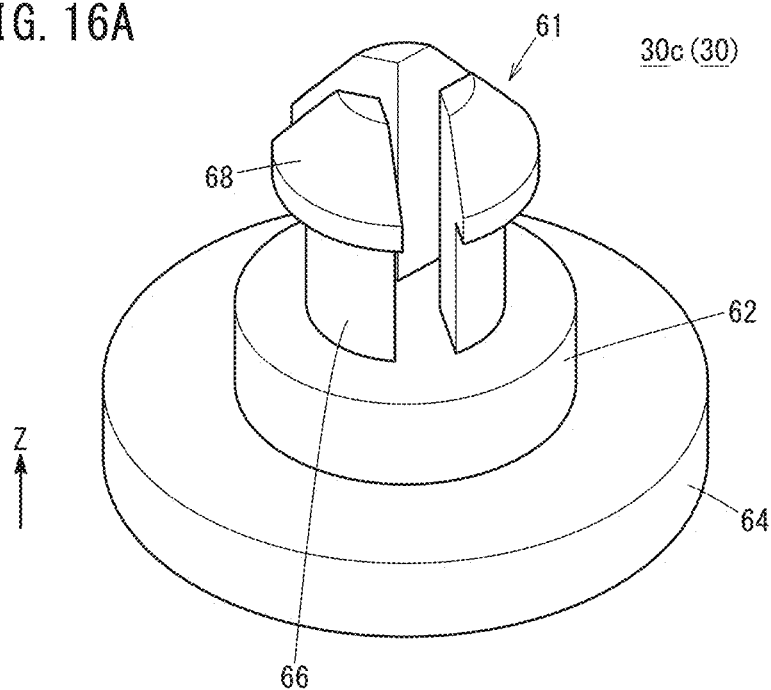
FIGS. 16A and 16B are perspective views of the protector.
Figure 16B:
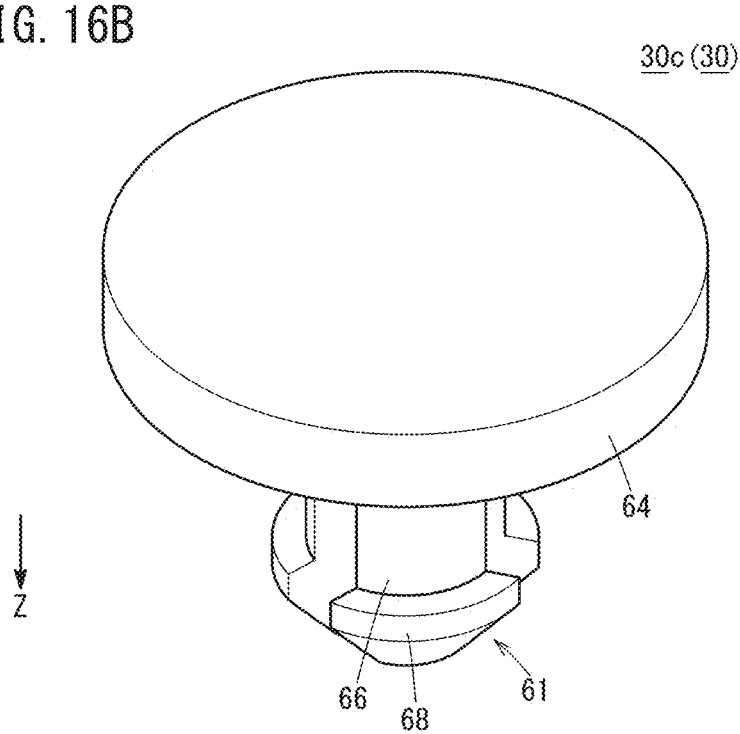
Figure 17A:
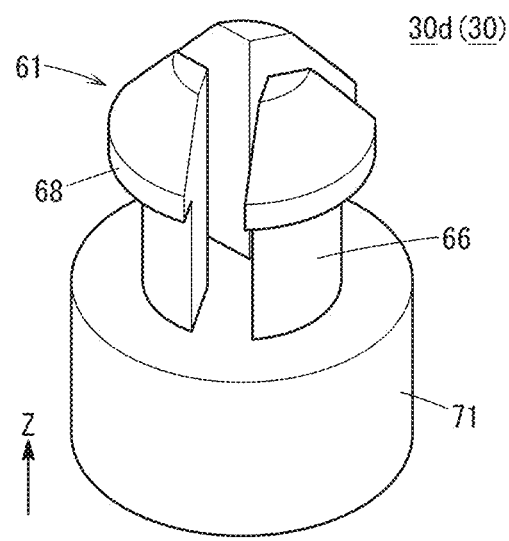
FIGS. 17A and 17B are perspective views of the protector.
Figure 17B:
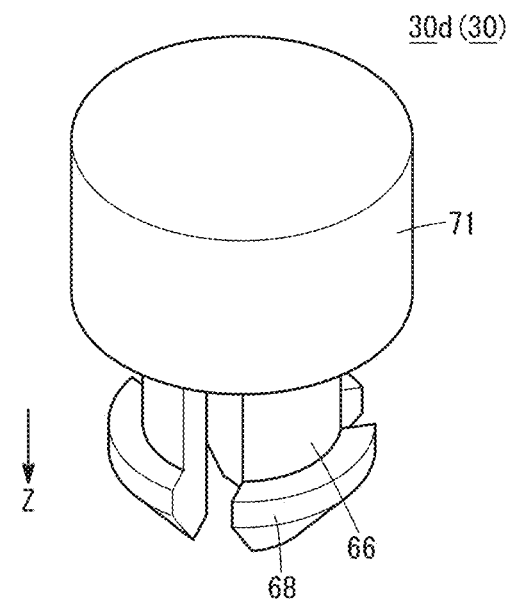
Figure 18:
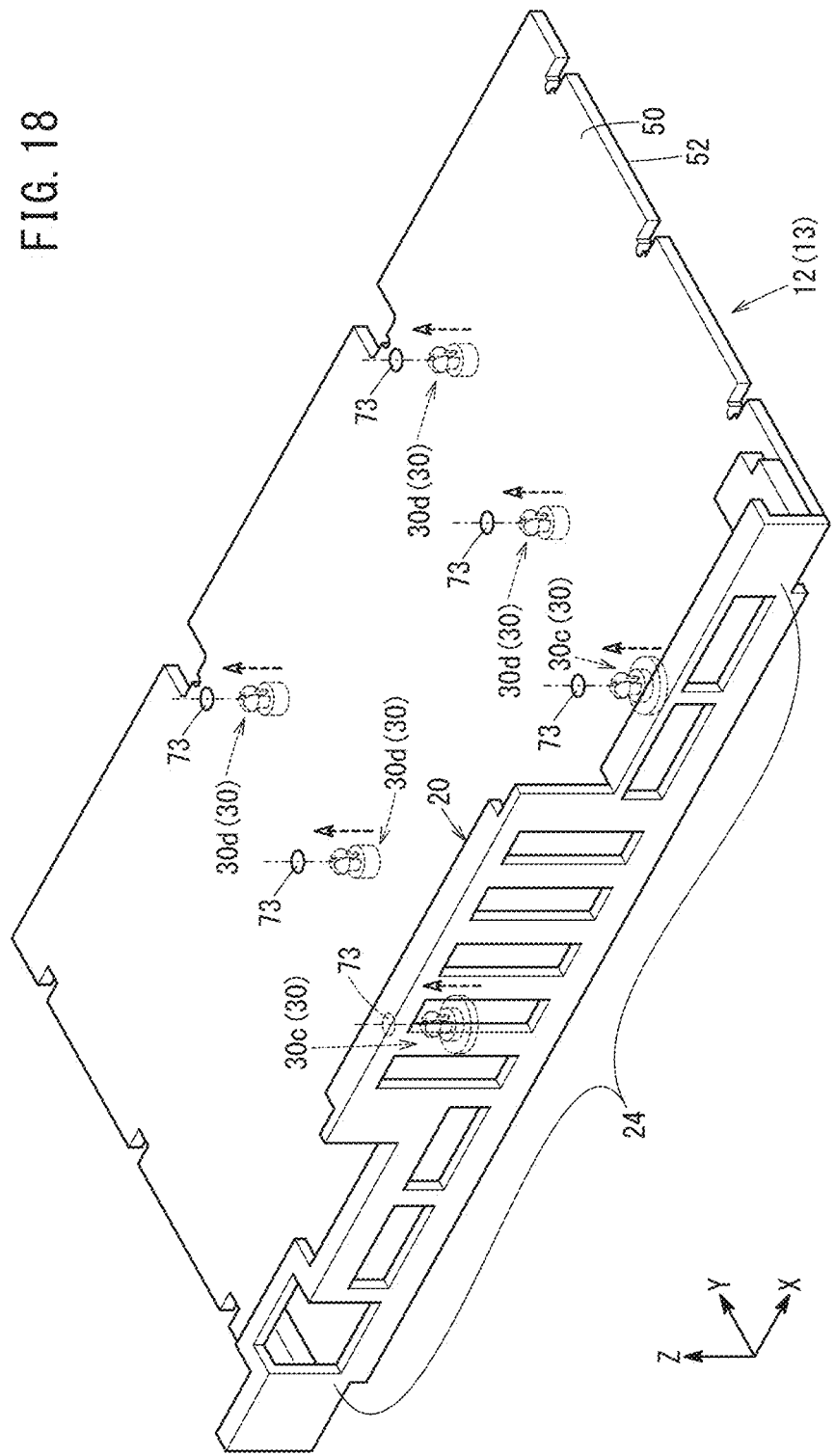
FIG. 18 is a view showing a method of attaching the protector to the main board.

FIG. 15 is a perspective view showing the main board 12, the face plate 20, and the protector 30. FIGS. 16A and 16B are perspective views of the protector 30 (a third protector 30c). FIGS. 17A and 17B are perspective views of the protector 30 (a fourth protector 30d). FIG. 18 is a view showing a method of attaching the protector 30 to the main board 12.

Six of the protectors 30 are provided on the back surface 52 of the main board 12. The height of the protector 30 in the Z axis direction is formed higher than the height in the Z axis direction of the electronic component 15 mounted on the back surface 52 of the main board 12. Moreover, the height of the protector 30 in the Z axis direction is formed in such a manner that, in a state where the main board 12 with the protectors 30 attached thereto is housed within the casing 14, the side surface of the protector 30 on the Z axis negative direction side abuts on the interior side surface 26 of the casing 14.

One protector of the protectors 30 that is provided on the most positive side in the Y axis direction is positioned closer to the Y axis positive direction side than one electronic component of the electronic components 15 that is mounted on the most positive side in the Y axis direction. When the main board 12 is inserted into the casing 14, the side surface of the protector 30 on the Z axis negative direction side moves while abutting on the interior side surface 26 of the casing 14, hence the warpage of the interior side surface 26 deformed toward the inside of the casing 14 is corrected so as to be planar.

The protector 30 includes two differently shaped kinds of protector 30, namely, a third protector 30c and a fourth protector 30d. Of the six protectors 30 attached to the main board 12, the two attached on the Y axis negative direction side are the third protectors 30c, and the other four are the fourth protectors 30d.

As shown in FIGS. 16A and 16B, the third protector 30c includes a snap-fit 61, a small diameter section 62, and a restricting section 64. The snap-fit 61 has a third arm section 66 that extends in the Z axis positive direction. A third hook section 68 projecting toward an outer peripheral side is formed at a tip of the third arm section 66.

The small diameter section 62 is formed on the Z axis negative direction side of the snap-fit 61. Similarly to in the first embodiment, the restricted section 74 is formed on the interior side surface 26 of the casing 14. A diameter of the small diameter section 62 is formed smaller than a distance between the two horizontal wall sections 78 of the restricted section 74 formed on the interior side surface 26 of the casing 14. A diameter of the restricting section 64 is formed larger than the distance between the two horizontal wall sections 78 of the restricted section 74. When the main board 12 is inserted into the casing 14, the restricting section 64 of the third protector 30c is inserted into the restricted section 74 of the interior side surface 26. When there occurs a warpage of the interior side surface 26 deforming toward the outside of the casing 14, the restricting section 64 of the third protector 30c abuts on the restricted section 74, whereby the warpage is suppressed.

As shown in FIGS. 17A and 17B, the fourth protector 30d includes the snap-fit 61 and a cylindrical section 71. The snap-fit 61 is formed in the same shape as the snap-fit 61 of the third protector 30c. A diameter of the cylindrical section 71 is formed smaller than the distance between the two horizontal wall sections 78 of the restricted section 74 formed on the interior side surface 26 of the casing 14.

As shown in FIG. 18, a through-hole 73 penetrating in the Z axis direction is formed at each of six places in the main board 12. The snap-fits 61 of the third protectors 30c and fourth protectors 30d are inserted into the respective through-holes 73, and the third protectors 30c and fourth protectors 30d are pressed toward the Z axis positive direction side, whereby the third hook sections 68 are engaged with the front surface 50 of the main board 12.

Note that the number of protectors 30 is not limited to six. Moreover, the protector 30 only has to be disposed close to the electronic component 15 to be protected, and a position where the protector 30 is disposed on the main board 12 should be appropriately changed. Moreover, the protector 30 may be attached also to an electronic circuit board 13 other than the main board 12.

[Operational Advantages]

In the CNC 10 of the present embodiment, the protector 30 is provided on the back surface 52 of the main board 12, and the height of this protector 30 in the Z axis direction is formed higher than the height of the electronic component 15 mounted on the main board 12. Furthermore, a configuration is adopted whereby the protector 30 abuts on the interior side surface 26 of the casing 14 in a state that the main board 12 is housed within the casing 14. As a result, since the warpage of the inwardly deformed interior side surface 26 can be corrected by the protector 30 when the main board 12 is inserted into the casing 14, it can be suppressed that the electronic component 15 mounted on the main board 12 and the side surface of the casing 14 interfere with each other during insertion/removal of the main board 12 in/from the casing 14.

Fourth Embodiment

Figure 19:
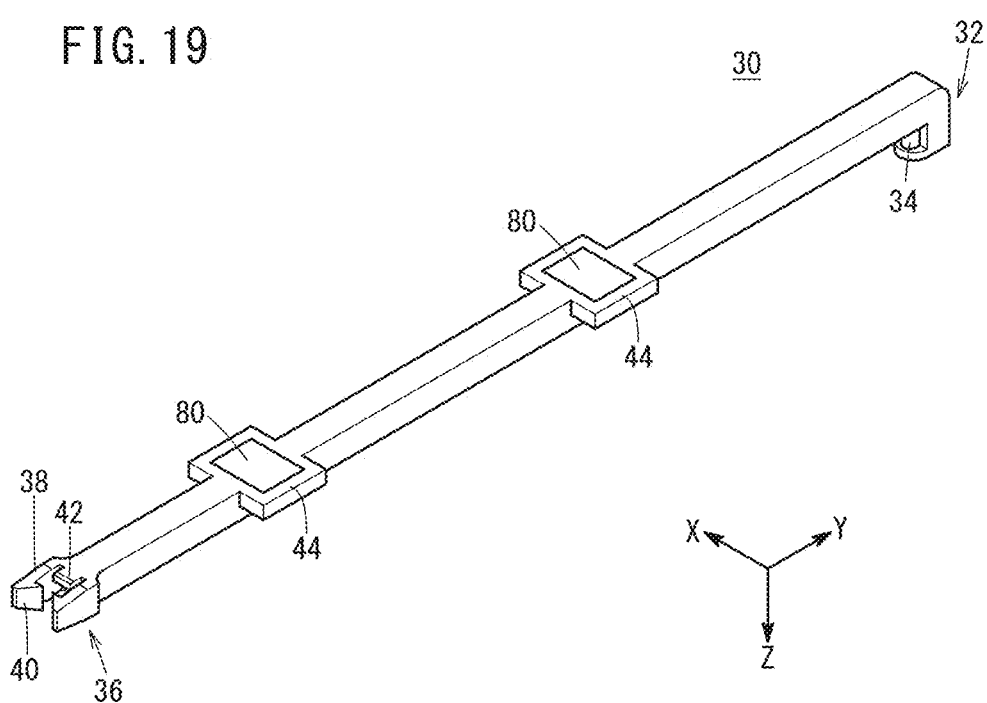
FIG. 19 is a perspective view of the protector.
Figure 20:
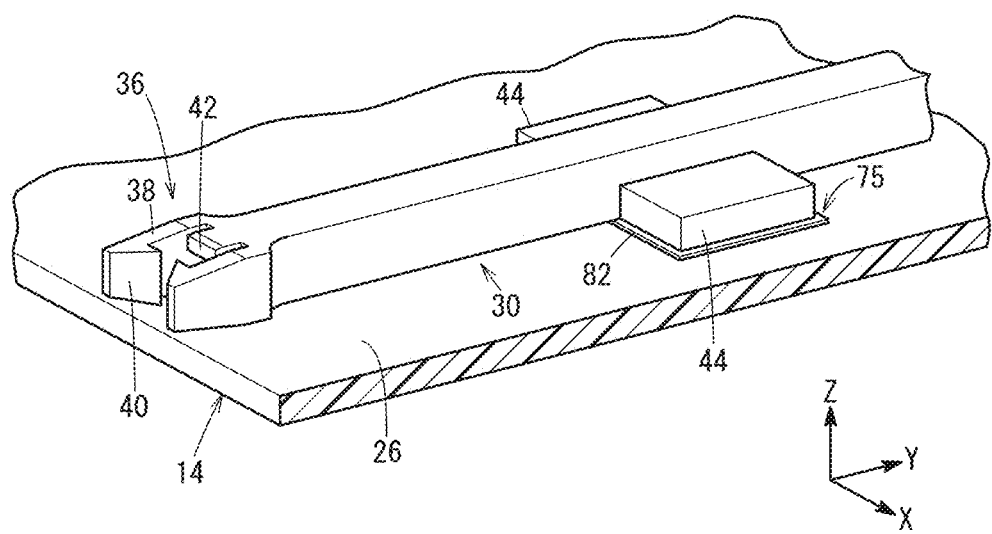
FIG. 20 is an enlarged view of the restricting section of the protector and the restricted section of the casing.

FIG. 19 is a perspective view of the protector 30. FIG. 20 is an enlarged view of the restricting section 44 of the protector 30 and a restricted section 75 of the casing 14.

Although a shape of the protector 30 of the present embodiment itself is the same as that of the protector 30 of the first embodiment, a side surface of the restricting section 44 on the Z axis negative direction side is provided with a magnet 80. Moreover, in the present embodiment, a place where the restricted section 74 had been formed on the interior side surface 26 of the casing 14 in the first embodiment, is provided with a magnet 82 as the restricted section 75 of the present embodiment.

When the main board 12 is inserted into the casing 14, the magnet 82 of the restricted section 75 of the interior side surface 26 and the magnet 80 of the restricting section 44 of the protector 30 are attracted to each other by a magnetic force. As a result, the warpage of the interior side surface 26 deforming to the outside of the casing 14 is suppressed.

[Operational Advantages]

In the CNC 10 of the present embodiment, a configuration is adopted whereby the restricting section 44 of the protector 30 is attracted to the restricted section 75 of the interior side surface 26 of the casing 14 by a magnetic force. As a result, the restricting section 44 of the protector 30 magnetically attracts the restricted section 75 of the interior side surface 26, and the warpage of the interior side surface 26 deforming to the outside of the casing 14 can be suppressed.

[Technical Ideas Obtained from Embodiments]

Technical ideas understandable from the above-described embodiments will be described below.

The electronic device (11) includes: a casing (14); and an electronic circuit board (13) housed within the casing (14). The electronic device (11) further includes a protector (30) which is provided on a surface of the electronic circuit board (13) that faces the casing (14), wherein the height of the protector is larger than the height of an electronic component (15) mounted on the surface of the electronic circuit board (13) that faces the casing (14), and, in a state that the electronic circuit board (13) is housed within the casing (14), the protector abuts on a surface of the casing (14) that faces the electronic circuit board (13). As a result, since a warpage of the inwardly-deformed interior side surface (26) can be corrected by the protector (30) when a main board (12) is inserted into the casing (14), it is possible to prevent the electronic component (15) mounted on the main board (12) from interfering with a side surface of the casing (14) during insertion/removal of the main board (12) into/from the casing (14).

In the above-described electronic device (11), the electronic circuit board (13) may be housed within the casing (14) by being inserted into the casing in one direction from an opening (22) of the casing (14), and the protector (30) may be formed into a rod shape extending in a direction that the electronic circuit board (13) is inserted. As a result, as the main board (12) is being inserted into the casing (14), the protector (30) can make overall correction of the warpage of the interior side surface (26) deformed toward the inside of the casing (14).

In the above-described electronic device (11), the protector (30) may be connected to a face plate (20) configured to hold the electronic circuit board (13) and close the opening (22) of the casing (14), and a length of the protector (30) may be longer than a distance between the face plate (20) and the electronic component (15) mounted in a position furthest from the face plate (20). This makes it possible to prevent all of the electronic components (15) mounted on the main board (12) from interfering with the casing (14).

In the above-described electronic device (11), the protector (30) may include a restricting section (44, 64) configured to engage with a restricted section (74) formed on the surface of the casing (14) that faces the electronic circuit board (13). As a result, when a warpage deforming toward the outside of the casing (14) occurs in the interior side surface (26), the restricting section (44, 64) of the protector (30) abuts on the restricted section (74) of the interior side surface (26), whereby the warpage of the interior side surface (26) can be suppressed.

In the above-described electronic device (11), the protector (30) may include a restricting section (44) configured to attract, by a magnetic force, a restricted section (75) formed on the surface of the casing (14) that faces the electronic circuit board (13). As a result, the restricting section (44) of the protector (30) attracts the restricted section (75) of the interior side surface (26), and the warpage of the interior side surface (26) deforming toward the outside of the casing (14) can be suppressed.

The present invention is not particularly limited to the embodiments described above, and various modifications are possible without departing from the essence and gist of the present invention.

What is claimed is:

1. An electronic device comprising:
a casing; and
an electronic circuit board housed within the casing,
the electronic device further comprising a protector which is provided on a surface of the electronic circuit board that faces the casing, wherein a height of the protector is larger than a height of an electronic component mounted on the surface of the electronic circuit board that faces the casing wherein the protector does not extend over the electronic component so that the electronic component is uncovered, and, in a state that the electronic circuit board is housed within the casing, the protector abuts on a surface of the casing that faces the electronic circuit board, wherein
the electronic circuit board is housed within the casing by being inserted into the casing in one direction from an opening of the casing, and
the protector is formed into a rod shape extending in a direction that the electronic circuit board is inserted, wherein
the protector includes a restricting section configured to engage with a restricted section formed on the surface of the casing that faces the electronic circuit board.

2. The electronic device according to claim 1 wherein
the protector is connected to a face plate configured to hold the electronic circuit board and close the opening of the casing, and
a length of the protector is longer than a distance between the face plate and the electronic component mounted in a position furthest from the face plate.

3. The electronic device according to claim 1, wherein
the protector includes a restricting section configured to attract, by a magnetic force, a restricted section formed on the surface of the casing that faces the electronic circuit board.

* * * * *